United States Patent
Patterson et al.

(10) Patent No.: US 9,780,295 B2
(45) Date of Patent: Oct. 3, 2017

(54) LEAD-FREE PIEZOELECTRIC MATERIAL

(71) Applicant: Hewlett-Packard Development Company, L.P., Houston, TX (US)

(72) Inventors: Eric Andrew Patterson, Corvallis, OR (US); David Cann, Corvallis, OR (US); Peter Mardilovich, Corvallis, OR (US)

(73) Assignees: OREGON STATE UNIVERSITY OFFICE OF TECHNOLOGY TRANSFER, Corvallis, OR (US); HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 188 days.

(21) Appl. No.: 14/759,569

(22) PCT Filed: Jan. 28, 2013

(86) PCT No.: PCT/US2013/023369
§ 371 (c)(1),
(2) Date: Jul. 7, 2015

(87) PCT Pub. No.: WO2014/116244
PCT Pub. Date: Jul. 31, 2014

(65) Prior Publication Data
US 2015/0372221 A1 Dec. 24, 2015

(51) Int. Cl.
*H01L 41/187* (2006.01)
*C04B 35/462* (2006.01)
(Continued)

(52) U.S. Cl.
CPC ...... *H01L 41/1878* (2013.01); *B41J 2/14233* (2013.01); *C04B 35/462* (2013.01);
(Continued)

(58) Field of Classification Search
CPC ............ H01L 41/0805; H01L 41/1873; H01L 41/1878; C04B 2235/3201;
(Continued)

(56) References Cited

U.S. PATENT DOCUMENTS 6,004,474 A 12/1999 Takenaka et al.
7,804,231 B2 9/2010 Ifuku et al.
(Continued)

FOREIGN PATENT DOCUMENTS

CN 102633503 A 8/2012
EP 1253122 A1 10/2002
(Continued)

OTHER PUBLICATIONS

Takenaka, T. et al., "Lead-free piezoelectric ceramics based on perovskite structures", J Electroceram, Feb. 24, 2007, pp. 259-265.
(Continued)

*Primary Examiner* — Matthew E Hoban
*Assistant Examiner* — Lynne Edmondson
(74) *Attorney, Agent, or Firm* — HP Inc.—Patent Department

(57) ABSTRACT

A lead-free piezoelectric ceramic material has the general chemical formula $xBiCoO_3-y(Bi_{0.5}Na_{0.5})TiO_3-z(Bi_{0.5}K_{0.5})TiO_3$, $xBiCoO_3-y(Bi_{0.5}Na_{0.5})TiO_3-zNaNbO_3$, $xBiCoO_3-y(Bi_{0.5}Na_{0.5})TiO_3-zKNbO_3$, $xBiCoO_3-yBi(Mg_{0.5}Ti_{0.5})O_3-z(Bi_{0.5}Na_{0.5})TiO_3$, $xBiCoO_3-yBaTiO_3-z(Bi_{0.5}Na_{0.5})TiO_3$, or $xBiCoO_3-yNaNbO_3-zKNbO_3$; wherein $x+y+z=1$, and x, y, $z \neq 0$.

14 Claims, 4 Drawing Sheets

(51) Int. Cl.
*C04B 35/475* (2006.01)
*C04B 35/465* (2006.01)
*C04B 35/495* (2006.01)
*H01L 41/09* (2006.01)
*B41J 2/14* (2006.01)
*C04B 35/468* (2006.01)

(52) U.S. Cl.
CPC ........ *C04B 35/465* (2013.01); *C04B 35/4682* (2013.01); *C04B 35/475* (2013.01); *C04B 35/495* (2013.01); *H01L 41/0973* (2013.01); *H01L 41/1873* (2013.01); *B41J 2202/03* (2013.01); *C04B 2235/3201* (2013.01); *C04B 2235/3206* (2013.01); *C04B 2235/3234* (2013.01); *C04B 2235/3251* (2013.01); *C04B 2235/3275* (2013.01); *C04B 2235/3298* (2013.01)

(58) Field of Classification Search
CPC .... C04B 2235/3206; C04B 2235/3234; C04B 2235/3251; C04B 35/462; C04B 35/465; C04B 35/4682; C04B 35/475; C04B 35/495; C30B 29/24
USPC ..... 252/62.9 PZ, 62.9 R; 501/134, 136, 137; 310/358
See application file for complete search history.

(56) References Cited

U.S. PATENT DOCUMENTS 8,182,713 B2   5/2012   Xiaobing et al.
8,241,569 B2   8/2012   Shih et al.
2011/0298336 A1*  12/2011  Saito .................. B82Y 30/00
                                                310/358

FOREIGN PATENT DOCUMENTS

JP   2002321976 A   11/2002
JP   2004075449 A   3/2004
WO   2012044309 A1   4/2012
WO   2012044313 A1   4/2012

OTHER PUBLICATIONS

Panda, P.K., "Review: environmental friendly lead-free piezoelectric materials", J Mater Sci, Jul. 7, 2009, pp. 5049-5062.
Guo, F. et al., "Morphotropic phase boundary and electric properties in (1-x)Bi0.5Na0.5TiO3—xBiCoO3 lead-free piezoelectric ceramics", Journal of Applied Physics, Jun. 26, 2012, 6 pgs.
PCT Search Report and Written Opinion for PCT/US2013/023369, dated Sep. 6, 2013, 9 pgs.
Tu Na et al., <PIEZOELECTECTRICS&ACOUSTOOPTICS>, vol. 34, No. 5, pp. 756-757, Oct. 31, 2012.
Wang Xiang et al., <PIEZOELECTECTRICS &ACOUSTOOPTICS>, vol. 29, No. 2, pp. 210-211, Apr. 30, 2007.
Wu W et al: °Polymorphic phase transition-induced electrical behavior of BiCo03-modified (K0.48Na0.52)Nb03 lead-free piezoelectric ceramics, Journal of Alloys and Compounds, vol. 509, No. 29, Jul. 21, 2011 (Jul. 21, 2011) pp. L284-L288, XP055293568.
Zhou C et al: "Structure and electrical properties of Bi0.5Na0.5Ti03—Bi0.5K0.5Ti03—BiCo03 lead-free piezoelectric ceramics", Journal of Materials Science, vol. 44, No. 14, May 15, 2009 (May 15, 2009), pp. 3833-3840, XP019679871.

* cited by examiner

LEAD-FREE PIEZOELECTRIC MATERIAL

BACKGROUND

Piezoelectric ceramic materials (also referred to as piezoelectric ceramics or piezoceramics) have been widely used in applications such as actuators, transducers, resonators, sensors, and random access memories. For example, piezoelectric devices, such as piezoelectric inkjet printheads or sensors, can be prepared by stacking various piezoelectric materials, other films, and metal, e.g., conductors and/or electrodes, in specific configurations for piezoelectric actuation or piezoelectric sensing. In the case of a piezoelectric printhead, piezoelectric actuation on or in an ink chamber can be used to eject or jet fluids therefrom.

DETAILED DESCRIPTION

Figure 1:
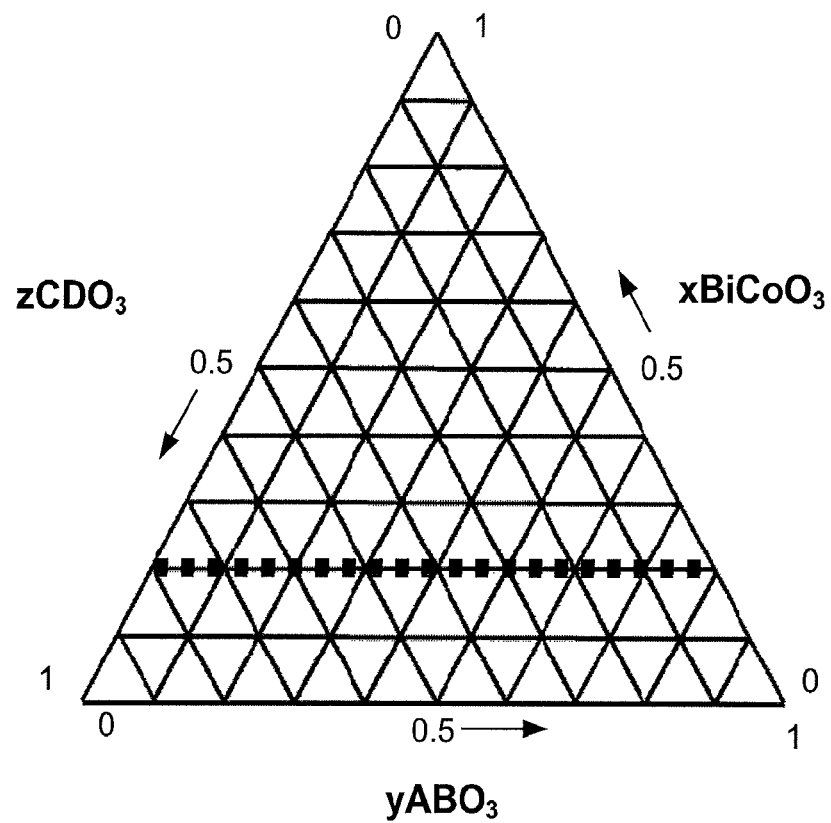
FIG. 1 is a composition/phase diagram illustrating the range of example lead-free piezoelectric ceramic materials.

In the following detailed description, reference is made to the accompanying drawings which form a part hereof, and in which is shown by way of illustration specific examples. In this regard, directional terminology, such as "top," "bottom," "front," "back," etc., is used with reference to the orientation of the Figure(s) being described. Because the various components can be positioned in a number of different orientations, the directional terminology is used for purposes of illustration and is in no way limiting. It is to be understood that other versions may be utilized and structural or logical changes may be made without departing from the scope of the present invention. The following detailed description, therefore, is not to be taken in a limiting sense, and the scope of the present invention is defined by the appended claims. It is to be understood that features of the various examples described herein may be combined with each other, unless specifically noted otherwise.

The term polarization hysteresis refers to lead-free piezoelectric ceramic materials that display non-linear polarization characteristics indicative of a polar state.

The term polarization remanence refers to the polarization measured at zero field during a polarization hysteresis measurement. It is a unique characteristic of polar, non-linear dielectrics.

The term electromechanical strain refers to an electric field induced strain and is commonly expressed in terms of one or more piezoelectric coefficients ($d_{33}$ and $d_{31}$, for example), where $d_{ij}$ (units pm/V) is the tensor property that relates the strain to the applied electric field (kV/cm). The $d_{33}$ coefficient can be measured in many different ways, such a piezoelectric resonance, the direct piezoelectric effect, the indirect piezoelectric effect, and others. In the context of this disclosure, the $d_{33}$ coefficient is calculated as the ratio between the maximum electromechanical strain at the maximum applied electric field ($d_{33}=S_{max}/E_{max}$) Sometimes this is described as the effective piezoelectric coefficient or the normalized strain or $d_{33}$*. An example of its use is given in Y. Hiruma et al., *J. Appl. Phys.* 103:084121 (2008).

In the context of piezoelectric ceramic materials, the term fatigue refers to the observed loss of polarization and electromechanical strain after the application of a cyclic electric field.

The relative amounts or proportions of the components in a lead-free piezoelectric material are expressed in terms of mole fraction or mole percent (mol %)

Temperature, ratios, concentrations, amounts, and other numerical data may be presented herein in a range format. It is to be understood that such range format is used merely for convenience and brevity, and should be interpreted flexibly to include not only the numerical values explicitly recited as the limits of the range, but also to include all the individual numerical values or sub-ranges encompassed within that range as if each numerical value and sub-range is explicitly recited. For example, a temperature range of about 100° C. to about 500° C. should be interpreted to include not only the explicitly recited limits of 100° C. and 500° C., but also to include every intervening temperature such as 250° C., 300° C., 350° C. and 400° C., and all sub-ranges such as 300° C. to 400° C., and so forth.

The term about when referring to a numerical value or range is intended to include larger or smaller values resulting from experimental error that can occur when taking measurements. Such measurement deviations are usually within plus or minus 10 percent of the stated numerical value.

Piezoelectric materials have been used widely for the applications such as actuators, transducers, resonators, sensors, random access memories, etc. Among these piezoelectric ceramics, lead zirconate titanate ("PZT"), Pb($Zr_xTi_{1-x}$)$O_3$ and its related solid solutions have been widely used due to their excellent piezoelectric properties and the ease with which modifications by doping can be made during manufacturing.

There are issues limiting use of PZT. One is environmental concern that is caused by the toxicity of lead. Another issue is fatigue behavior associated with PZT. Fatigue is a phenomenon in which the material loses its switchable polarization during electrical cyclic loading. There have been many investigations on the fatigue behavior of PZT under various conditions such as unipolar drive, DC, and bipolar drive with different temperature and frequency effects. In PZT under bipolar fatigue, it is widely believed that the agglomeration of charged point defects from oxygen vacancies, or charge carriers injected from the electrode, inhibits the movement of domain walls and this in turn causes a reduction of the switchable polarization.

The present disclosure provides lead-free piezoelectric materials that include $BiCoO_3$ ("BC") as an additive to lead-free piezoelectric systems, such as ($Bi_{0.5}Na_{0.5}$)$TiO_3$ ("BNT") or ($Bi_{0.5}K_{0.5}$)$TiO_3$ ("BKT") based systems. BC possesses high polarization and moderate $d_{33}$ values. Moreover, the addition of $BiCoO_3$ to lead-free piezoelectric materials is believed to control the defect equilibrium of the material due to the acceptor nature of $Co^{3+}$. Many device properties such as leakage current and fatigue properties are ultimately tied to point defects.

FIG. 1 is a schematic of the ternary phase diagram for the disclosed compositions. The ternary components are x$BiCoO_3$ (x≤0.2), y$ABO_3$ and z$CDO_3$, where x+y+z=1. $ABO_3$ and $CDO_3$ represent common Pb-free piezoelectric perovskite compositions such as $BaTiO_3$, $NaNbO_3$, $KNbO_3$, and compound perovskites such as $(Bi_{0.5}Na_{0.5})TiO_3$ and $(Bi_{0.5}K_{0.5})TiO_3$.

Examples of disclosed piezoelectric ceramic materials have one of the following general chemical formulas:

$$xBiCoO_3\text{-}y(Bi_{0.5}Na_{0.5})TiO_3\text{-}z(Bi_{0.5}K_{0.5})TiO_3;$$

$$xBiCoO_3\text{-}y(Bi_{0.5}Na_{0.5})TiO_3\text{-}zNaNbO_3;$$

$$xBiCoO_3\text{-}y(Bi_{0.5}Na_{0.5})TiO_3\text{-}zKNbO_3;$$

$$xBiCoO_3\text{-}yBi(Mg_{0.5}Ti_{0.5})O_3\text{-}z(Bi_{0.5}Na_{0.5})TiO_3;$$

$$xBiCoO_3\text{-}yBaTiO_3\text{-}z(Bi_{0.5}Na_{05})TiO_3; \text{ or}$$

$$xBiCoO_3\text{-}yNaNbO_3\text{-}zKNbO_3;$$

wherein $x+y+z=1$, and $x, y, z \neq 0$. For example, $0.01 \le x \le 0.2$ in some implementations. In some examples, the maximum value of x is limited to 0.1 to 0.2 due to the limitations on the solid solubility of BC.

Figure 2:
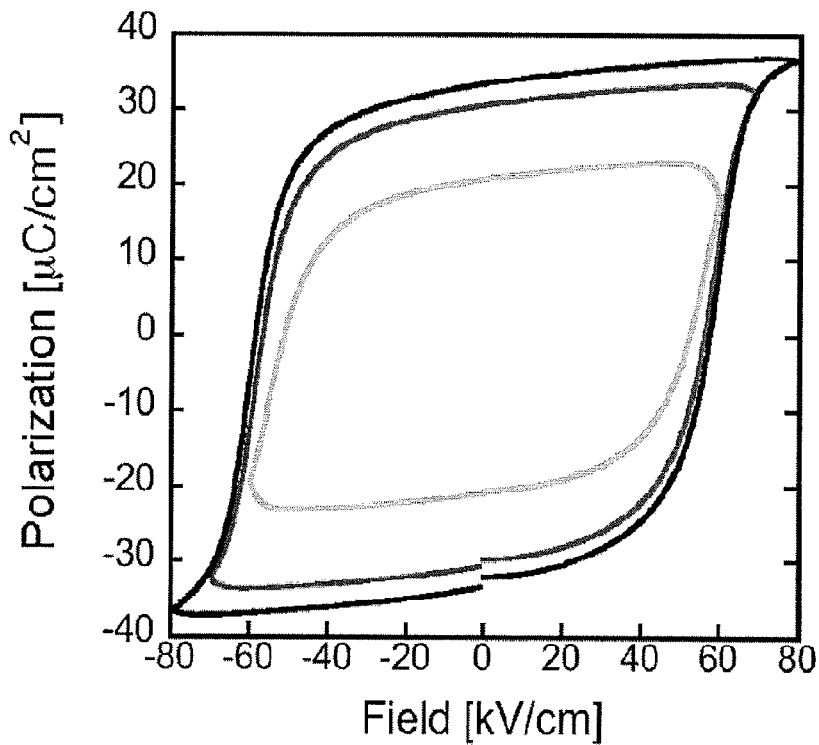
FIG. 2 is a graph of polarization hysteresis behavior for an example of a disclosed composition.

FIG. 2 shows polarization hysteresis behavior for $2BiCoO_3$-$98BNT$, which is characterized by fully saturated loops and a large remanent polarization of nearly 35 $\mu C/cm^2$. The remanent polarization is expected to be in the range of 25-40 $\mu C/cm^2$ for the systems disclosed herein. This level of polarization is comparable to Pb-based piezoelectric materials such as PZT as well as other known Pb-free candidate materials.

Figure 3:
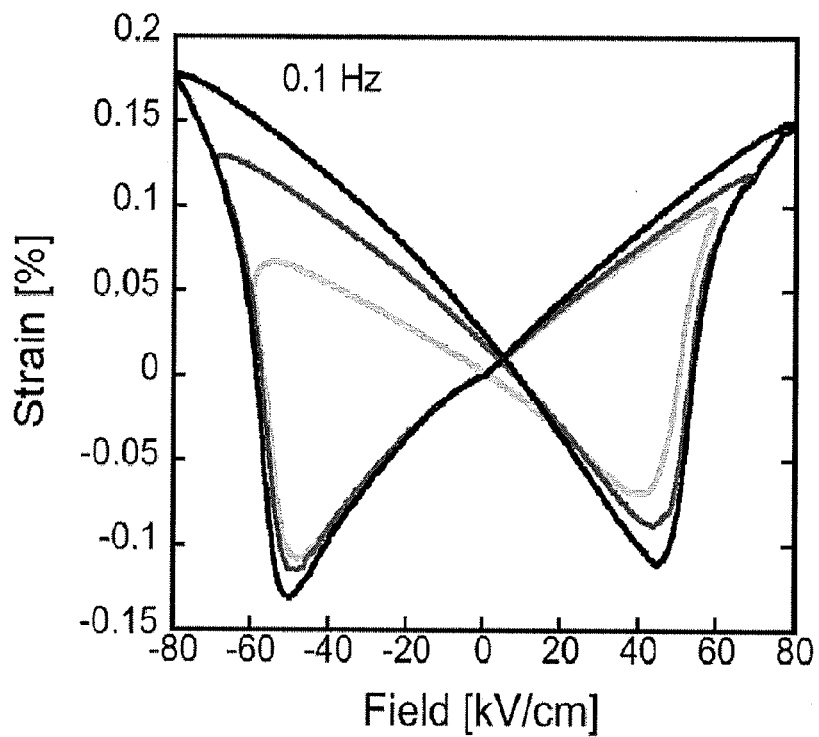
FIG. 3 is a graph of Bipolar strain vs. E-field for an example of a disclosed composition.
Figure 4:
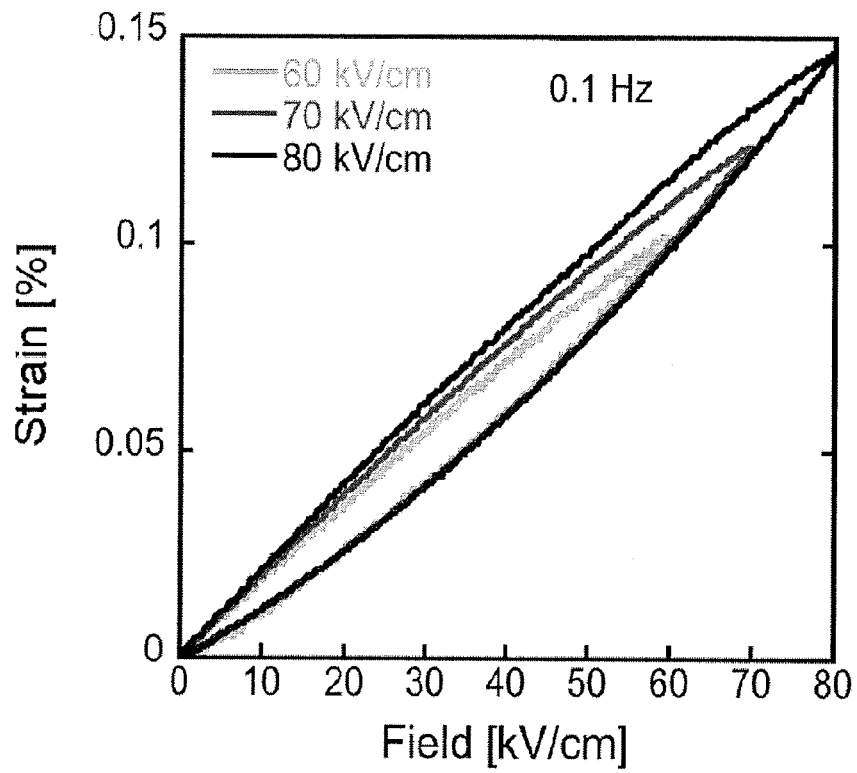
FIG. 4 is a graph of electromechanical strain under unipolar drive for an example of a disclosed composition.

FIG. 3 illustrates bipolar strain vs. E-field for $2BiCoO_3$-$98BNT$. The bipolar strain data shown in FIG. 3 exhibit large negative strains indicative of domain switching and maximum strains near 0.2%. FIG. 4 illustrates electromechanical strain under unipolar drive, with strain values of 0.15%. This corresponds to an effective piezoelectric strain coefficient $d_{33}^*$ of approximately 180 pm/V. The maximum electromechanical strain value and the piezoelectric strain coefficient $d_{33}^*$ are expected to be in the range of about 0.1% to 0.3% and 150-500 pm/V, respectively, for the ternary systems disclosed herein.

Figure 5:
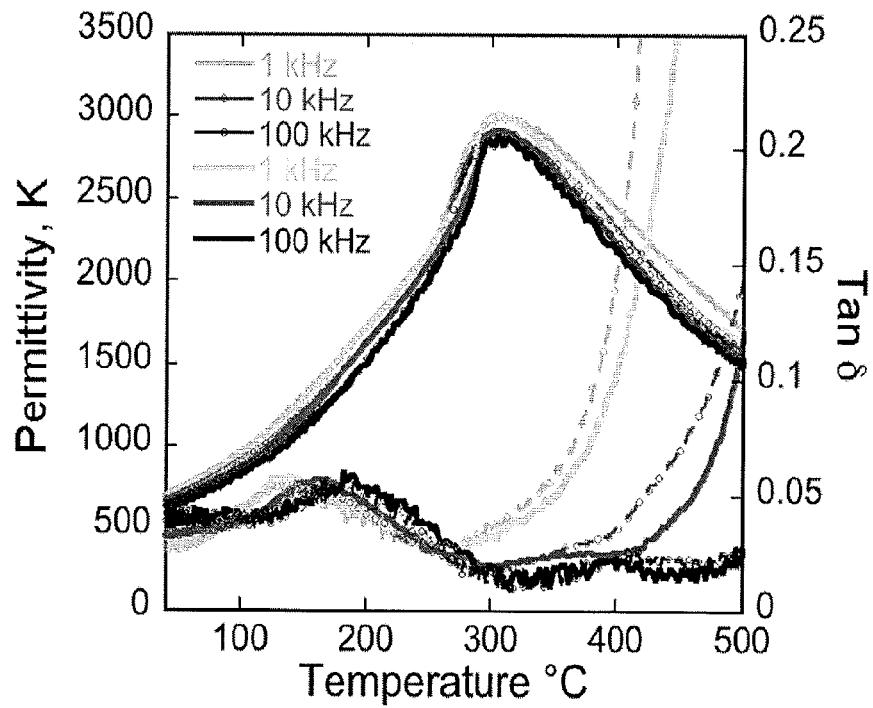
FIG. 5 is a graph of dielectric spectra for an example of a disclosed composition.

FIG. 5 illustrates the dielectric spectra which show a dielectric maximum at 300° C. This could indicate that the depolarization temperature of this material is as high as 300° C. which would be well suited for complex device fabrication processes.

Production of Lead-Free Piezoelectric Ceramics

A. Ceramic Discs

The lead-free BC-containing compositions described herein may be produced by any suitable solid-state synthesis method, using $Bi_2O_3$, $CoO$, $Co_2O_3$, $Co_3O_4$, $Na_2CO_3$, $K_2CO_3$, $ZnO$, and $TiO_2$ starting powders of at least 99% purity. The Curie temperature ($T_C$) of the resulting product is generally between about 100° C. and about 500° C. The $T_C$ of a piezoelectric ceramic may be increased or decreased by varying the relative amounts of the starting powders. The relative amounts of the constituents may be adjusted so that the product will have a $T_C$ in a specified range. In accordance with conventional solid state synthesis methods for making ceramic materials, the powders are milled, shaped and calcined to produce the desired ceramic product. Milling can be either wet or dry type milling, as is known in the art. High energy vibratory milling may be used, for instance, to mix starting powders and for post-calcination grinding. The powders are mixed with a suitable liquid (e.g., ethanol or water, or a combination of liquids) and wet milled with a suitable high density milling media (e.g., yttria stabilized zirconia (YSZ) beads). The milled powders are calcined, then mixed with a binder, formed into the desired shape (e.g., pellets) and sintered to produce a ceramic product with high sintered density. For testing purposes, prior to electrical measurements the ceramic disc may be polished to a suitable thickness (e.g., 0.9 mm), and a silver paste (e.g., Heraeus C1000) is applied to both sides of the discs. Depending upon the intended end use, a high-density BCBKTBNT ceramic disc or pellet may be polished to a thickness in the range of about 0.5 μm to about 1 μm, suitable for use as a piezoelectric actuator, for example.

B. Ceramic Thin Film

When the intended use of the BC-based ceramic material requires a thin film product, the production method may be modified to include chemical solution deposition using chemical precursors such bismuth nitrate, titanium isopropoxide, etc., or sputtering using solid state sintered or hot-pressed ceramic targets. Any suitable sputtering or chemical deposition method may be used for this purpose. The resulting thin film ceramic may have a thickness in the range of about 50 nm to about 10 μm, in some cases.

C. Piezoelectric Composites

For end uses such as sensors or transducers, which require the use piezoelectric composites, the above-described sintered BC-based ceramic material can be modified for this purpose. The ceramic powder is ground or milled to the desired particle size and loaded into polymer matrix to create a 0-3 piezoelectric composite. The ceramic powder can be formed into sintered rods or fibers using injection molding or similar technique and loaded into a polymer matrix to create a 1-3 piezoelectric composite. The polymer may be piezoelectric, such as PVDF, or non-piezoelectric such as epoxy depending on the final application.

The piezoelectric printhead is an example of an application for the disclosed lead-free piezoelectric material. In the case of a piezoelectric printhead, piezoelectric actuation on or in an ink chamber can be used to eject or jet fluids therefrom. The piezoelectric material can be grown or otherwise applied on the surface of a metal electrode, such as platinum, ruthenium, palladium, and iridium, as well as some conductive and non-conductive oxides, such as $IrO_2$, $SrRuO_3$, $ZrO_2$, etc.

Figure 6:
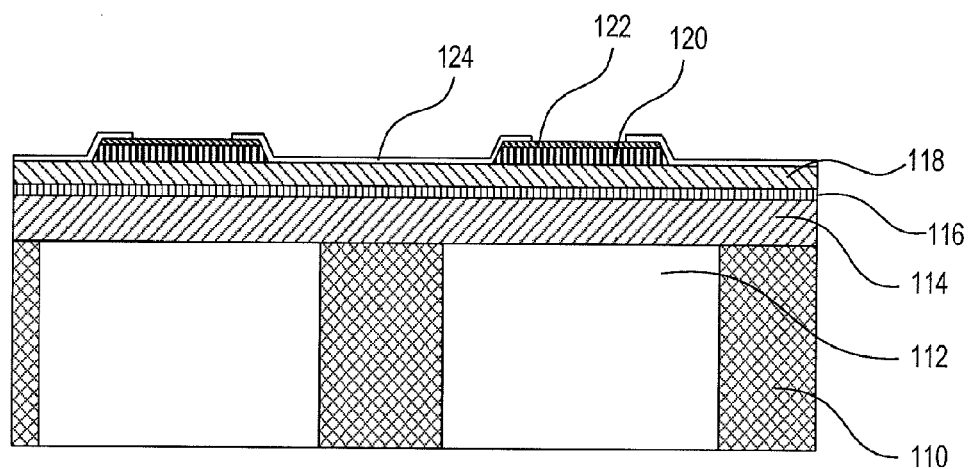
FIG. 6 is a schematic view illustrating a portion of an example inkjet printhead.

FIG. 6 is a schematic view of a portion of an inkjet printhead 100. In the illustrated example printhead 100, a silicon support is fabricated to include multiple ink chambers 112 for receiving and jetting ink therefrom. It is noted that often, ink chambers or other areas where ink may contact the printhead can be coated with any of a number of protective coatings. Those coatings are not shown, but it is understood that such a coating may be used for protective purposes without departing from the scope of the present disclosure. For example, tantalum or tantalum oxide coatings, such as $Ta_2O_5$, are often used for this purpose. Other support material(s) can be used alternatively or in addition to the mentioned silicon support and optional protective coatings. Thus, the term "support" typically includes structures comprising semi-conductive materials such as silicon wafer, either alone or in assemblies comprising other materials applied thereto. Metallic supports can also be used, including metallic materials with an insulating material applied thereto. Certain specific materials that can be used for the support material include silicon, glass, gallium arsenide, silicon on sapphire (SOS), germanium, germanium silicon, diamond, silicon on insulator (SOI) material, selective implantation of oxygen (SIMOX) substrates, or other similar materials. Furthermore, the substrate described herein can actually be the support material, particularly when the support material inherently includes an oxidized surface. However, in many typical examples, a separate membrane of oxidized material is applied to the support and acts as the substrate.

In FIG. 6, the printhead 100 includes a substrate 114, a first metal electrode 118, a piezoelectric layer 120, a second metal electrode 122, and a passivation layer 124. An adhesive layer 116 is provided between the substrate 114 and the piezoelectric layer 120 in some example printheads. Any suitable adhesive could be employed. Some typical printheads could additionally include further layers, including other insulating, semi-conducing, conducting, or protective layers that are not shown. However, one skilled in the art would recognize other layers that could optionally be used, or optionally omitted from the illustrated structure.

In the system shown, the first metal electrode 118 and the second metal electrode 122 are used to generate an electric field with respect to the piezoelectric layer 120, and as the piezoelectric layer is actuated, the thin film stack bends into an appropriate ink chamber 12, causing inkjetting to occur. The substrate layer 114 can be the support material with an oxide layer inherently present on its surface, but is typically prepared as an oxide membrane applied to the support material, e.g., $SiO_2$, $ZrO_2$, $HfO_2$, $Ta_2O_5$, $Al_2O_3$, $SrTiO_3$, etc. These membranes can be applied as multiple layers, and/or be prepared using multiple materials in a common layer. Thus, the materials are typically applied as one or more layer to the silicon or other support material as described above. When the substrate is in the form of a thin film or membrane, the substrate can be formed at a thickness from 10 Å to 10 μm, for example. In an example piezoelectric actuator device, the thickness of this substrate, e.g., oxidized membrane, can be approximately the same thickness as piezoelectric layer, e.g., at a 1:2 to 2:1 thickness ratio of substrate layer to piezoelectric layer, and both layers can be about 50 nm or greater.

In the printhead 100 illustrated in FIG. 6, a passivation layer 124 is shown, which can be formed of any suitable material, including, but not limited to wet or dry process silicon dioxide, aluminum oxide (e.g., $Al_2O_3$), silicon carbide, silicon nitride, tetraethylorthosilicate-based oxides, borophosphosilicate glass, phosphosilicate glass, or borosilicate glass, $HfO_2$, $ZrO_2$, or the like. Suitable thicknesses for this layer can be from 10 nm to 1 μm, though thicknesses outside of this range can also be used.

The metal electrodes 118, 122 can be applied at a thickness from about 5 nm to 5 microns, though thicknesses outside this range can also be used. Materials that can be used, particularly for electrodes, typically include noble metals or other metals or alloys, including but not limited to, platinum, copper, gold, ruthenium, iridium, silver, nickel molybdenum, rhodium, and palladium. In other examples, oxides of these or other metals can also be used, such as $IrO_2$ or $SrRuO_3$, if the adhesive properties of the adhesion layers of the present disclosure would be beneficial for use. Platinum is of particular interest as a metal that benefits from the adhesive layers of the present disclosure because its surface does not become readily oxidized. Metal electrodes (or metals applied for another purpose, such as for conductive layers or traces) can be deposited using any technique known in the art, such as sputtering, evaporation, growing the metal on a substrate, plasma deposition, electroplating, etc.

In accordance with the present disclosure, the piezoelectric layer 120 illustrated in FIG. 6 includes a lead-free piezoelectric ceramic material having the general chemical formula $xBiCoO_3$-$y(Bi_{0.5}Na_{3.5})TiO_3$-$z(Bi_{0.5}K_{0.5})TiO_3$;

$xBiCoO_3$-$y(Bi_{0.5}Na_{0.5})TiO_3$-$zNaNbO_3$;

$xBiCoO_3$-$y(Bi_{0.5}Na_{0.5})TiO_3$-$zKNbO_3$;

$xBiCoO_3$-$yBi(Mg_{0.5}Ti_{0.5})O_3$-$z(Bi_{0.5}Na_{3.5})TiO_3$;

$xBiCoO_3$-$yBaTiO_3$-$z(Bi_{0.5}Na_{0.5})TiO_3$; or $xBiCoO_3$-$yNaNbO_3$-$zKNbO_3$;

wherein x+y+z=1, and x, y, z≠0, as discussed herein above. The piezoelectric layer 120 may have, for example, a thickness in the range of about 50 nm to about 10 μm for a thin-film structure. In other printhead designs, such as those using the disclosed lead-free piezoelectric ceramic materials in bulk, the dimensions and layers configurations would be adjusted accordingly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A lead-free piezoelectric ceramic material having the general chemical formula:

$xBiCoO_3$-$y(Bi_{0.5}Na_{0.5})TiO_3$-$zNaNbO_3$;

$xBiCoO_3$-$y(Bi_{0.5}Na_{0.5})TiO_3$-$zKNbO_3$;

$xBiCoO_3$-$yBi(Mg_{0.5}Ti_{0.5})O_3$-$z(Bi_{0.5}Na_{0.5})TiO_3$; or $xBiCoO_3$-$yBaTiO_3$-$z(Bi_{0.5}Na_{0.5})TiO_3$;

wherein x+y+z=1, and x, y, z≠0.

2. The lead-free piezoelectric ceramic material of claim 1, wherein 0.01≤x≤0.2.

3. The lead-free piezoelectric ceramic material of claim 1, wherein x≤0.2.

4. The lead-free piezoelectric ceramic material of claim 1, wherein the ceramic material has an effective piezoelectric strain coefficient $d_{33}*$ of about 150-500 pm/V.

5. The lead-free piezoelectric ceramic material of claim 1, wherein the ceramic material has a maximum electromechanical strain value of about 0.1% to 0.3%.

6. The lead-free piezoelectric ceramic material of claim 1, wherein the ceramic material has a remanent polarization of about 25-40 μC/cm².

7. The lead-free piezoelectric ceramic material of claim 1, wherein the ceramic material has a remanent polarization equal to or exceeding that of a lead-based piezoelectric material.

8. The lead-free piezoelectric ceramic material of claim 1, wherein the ceramic material is a piezoelectric layer of a thin film stack, and wherein the piezoelectric layer is situated between first and second metal layers of the thin film stack.

9. The lead-free piezoelectric ceramic material of claim 8, wherein the thin film stack is an actuator for a fluid ejection device.

10. A lead-free piezoelectric ceramic material having the general chemical formula:

$xBiCoO_3-y(Bi_{0.5}Na_{0.5})TiO_3-z(Bi_{0.5}K_{0.5})TiO_3$;

$xBiCoO_3-y(Bi_{0.5}Na_{0.5})TiO_3-zNaNbO_3$;

$xBiCoO_3-y(Bi_{0.5}Na_{0.5})TiO_3-zKNbO_3$;

$xBiCoO_3-yBi(Mg_{0.5}Ti_{0.5})O_3-z(Bi_{0.5}Na_{0.5})TiO_3$;

$xBiCoO_3-yBaTiO_3-z(Bi_{0.5}Na_{0.5})TiO_3$; or $xBiCoO_3-yNaNbO_3-zKNbO_3$;

wherein $x+y+z=1$, and x, y, $z \neq 0$; and
wherein the ceramic material has an effective piezoelectric strain coefficient $d_{33}^*$ of 180-500 pm/V.

11. The lead-free piezoelectric ceramic material of claim 10, wherein $x \leq 0.2$.

12. The lead-free piezoelectric ceramic material of claim 10, wherein the ceramic material has a maximum electromechanical strain value of 0.15% to 0.3%.

13. The lead-free piezoelectric ceramic material of claim 10, wherein the ceramic material is a piezoelectric layer of a thin film stack, and wherein the piezoelectric layer is situated between first and second metal layers of the thin film stack.

14. The lead-free piezoelectric ceramic material of claim 13, wherein the thin film stack is an actuator for a fluid ejection device.

* * * * *

UNITED STATES PATENT AND TRADEMARK OFFICE
CERTIFICATE OF CORRECTION

PATENT NO. : 9,780,295 B2  
APPLICATION NO. : 14/759569  
DATED : October 3, 2017  
INVENTOR(S) : Eric Andrew Patterson et al.

Page 1 of 1

It is certified that error appears in the above-identified patent and that said Letters Patent is hereby corrected as shown below:

On the Title Page

In item (57), abstract, in Column 2, Lines 2-7:
Delete "$xBiCoO3$-$y(Bi0.5Na0.5)TiO3$-$z(Bi0.5K0.5)TiO3$, $xBiCoO3$-$y(Bi0.5Na0.5)TiO3$-$zNaN$-$bO3$, $xBiCoO3$-$y(Bi0.5Na0.5)TiO3$-$zKNbO3$, $xBiCoO3$-$yBi(Mg0.5Ti0.5)O3$-$z(Bi0.5Na0.5)TiO3$, $xBiCoO3$-$yBa$-$TiO3$-$z(Bi0.5Na0.5)TiO3$, or $xBiCoO3$-$yNaNbO3$-$zKNbO3$;"
And insert -- $xBiCoO_3$-$y(Bi_{0.5}Na_{0.5})TiO_3$-$z(Bi_{0.5}K_{0.5})TiO_3$, $xBiCoO_3$-$y(Bi_{0.5}Na_{0.5})TiO_3$-$zNaNbO_3$, $xBiCoO_3$-$y(Bi_{0.5}Na_{0.5})TiO_3$-$zKNbO_3$, $xBiCoO_3$-$yBi(Mg_{0.5}Ti_{0.5})O_3$-$z(Bi_{0.5}Na_{0.5})TiO_3$, $xBiCoO_3$-$yBaTiO_3$-$z(Bi_{0.5}Na_{0.5})TiO_3$, or $xBiCoO_3$-$yNaNbO_3$-$zKNbO_3$; --, therefor.

Signed and Sealed this  
Third Day of July, 2018

Andrei Iancu  
*Director of the United States Patent and Trademark Office*